(12) United States Patent
Kanda

(10) Patent No.: US 7,226,726 B2
(45) Date of Patent: Jun. 5, 2007

(54) AQUEOUS SURFACTANT SOLUTION FOR DEVELOPING COATING FILM LAYER

(75) Inventor: Takashi Kanda, Shizuoka (JP)

(73) Assignee: AZ Electronic Materials USA Corp., Somerville, NJ (US)

( * ) Notice: Subject to any disclaimer, the term of this patent is extended or adjusted under 35 U.S.C. 154(b) by 0 days.

(21) Appl. No.: 10/872,603

(22) Filed: Jun. 21, 2004

(65) Prior Publication Data

US 2004/0229170 A1    Nov. 18, 2004

Related U.S. Application Data

(63) Continuation of application No. 10/089,414, filed as application No. PCT/JP01/06262 on Jul. 19, 2001, now abandoned.

(30) Foreign Application Priority Data

Aug. 4, 2000 (JP) .............................. 2000-237099

(51) Int. Cl.
- G03F 7/30 (2006.01)
- G03F 7/32 (2006.01)

(52) U.S. Cl. .............. 430/331; 430/311; 430/322; 510/405; 510/409; 510/411; 510/413; 510/421

(58) Field of Classification Search ............. 430/331, 430/311, 322; 510/405, 409, 411, 413, 421
See application file for complete search history.

(56) References Cited

U.S. PATENT DOCUMENTS

| | | | | |
|---|---|---|---|---|
| 3,341,375 A | * | 9/1967 | Reisman et al. ............ 438/301 |
| 3,438,504 A | * | 4/1969 | Furman ....................... 210/483 |
| 5,035,881 A | * | 7/1991 | Mori et al. .................... 424/54 |
| 5,126,229 A | * | 6/1992 | Akiyama et al. ............ 430/302 |
| 5,294,444 A | * | 3/1994 | Nakamura et al. .......... 424/401 |
| 6,080,707 A | * | 6/2000 | Glenn et al. ................. 510/130 |
| 6,090,772 A | * | 7/2000 | Kaiser et al. ............... 510/388 |
| 6,319,853 B1 | * | 11/2001 | Ishibashi et al. ............ 438/780 |
| 6,579,657 B1 | * | 6/2003 | Ishibashi et al. ......... 430/270.1 |

FOREIGN PATENT DOCUMENTS

| | | | |
|---|---|---|---|
| CN | 1222756 | | 7/1999 |
| EP | 0 436 947 | * | 7/1991 |
| EP | 1 308 787 | * | 5/2003 |

(Continued)

OTHER PUBLICATIONS

Partial machine English language translation of JP 9325502.*

(Continued)

*Primary Examiner*—Hoa Van Le
(74) *Attorney, Agent, or Firm*—Alan P. Kass

(57) ABSTRACT

The developer of the present invention is used in a method where a water-soluble resin coating layer is applied on a resist pattern formed by the conventional method, and the coating layer is crosslinked by an acid supplied from the resist, and the uncrosslinked area in the coating layer is dissolved and removed with a developer to thicken the resist pattern. This developer comprises an aqueous solution containing at least one surfactant selected from an N-acylsarcosinate, an N-acyl-N-methylalaninate, an N-acyltaurinate, an N-acyl-N-methyltaurinate, a fatty acid alkylol amide, and a fatty acid alkylol amide polyoxyethylene adduct.

9 Claims, 1 Drawing Sheet

FOREIGN PATENT DOCUMENTS

| JP | 02-245097 | * | 9/1990 |
| JP | 07-234522 | * | 9/1995 |
| JP | 08-101511 | * | 4/1996 |
| JP | 09-244262 |   | 9/1997 |
| JP | 09-325502 |   | 12/1997 |
| JP | 10-010754 |   | 1/1998 |
| JP | 10-073927 |   | 3/1998 |
| JP | 10-239836 | * | 9/1998 |
| JP | 11-038642 | * | 2/1999 |

OTHER PUBLICATIONS

Abstract and Machine English language translation of Japanese Patent Application JP 2648821.*

Abstract and Machine English language translation of Japanese Patent Application JP 08101511.*

Abstract and Machine English language translation of Japanese Patent Application JP 07234522.*

Abstract and Machine English language translation of Japanese Patent Application JP 10239836.*

Abstract and Machine English language translation of Japanese Patent Application JP 11038642.*

Machine English Language Translation of JP 09-244262.

Machine English Language Translation of JP 09-325502.

Machine English Language Translation of JP 10-010754.

Machine English Language Translation of JP 10-073927.

Copy of Substantive/Modified Substantive Examination and copy of Search Report (in English) for Malaysian patent application No. PI 20013263.

Copy of English Translation (and original language document) of Pre-Notification of Reasons for the Possible Rejection of the Pending Patent Examination dated Mar. 19, 2004; of Decision on Examination dated May 20, 2004; and of Pre-Notification of Reasons for the Possilbe Rejection of the Pending Patent Re-Examination dated Nov. 3, 2005 for Taiwanese patent application No. 90111701.

Copy of English language translation (and original language document) of Notice of the First Office Action dated Apr. 1, 2005 and of Notice of the Second Office Action dated Mar. 24, 2006 for Chinese patent application No. 01802203.0.

* cited by examiner

AQUEOUS SURFACTANT SOLUTION FOR DEVELOPING COATING FILM LAYER

CROSS REFERENCE TO RELATED PATENT APPLICATION

The application is a continuation of Ser. No. 10/089,414, filed Aug. 13, 2002 now abandoned, and claims priority to Japanese Patent Application No. 2000-237099, filed Aug. 4, 2000 and Patent Cooperation Treaty International Application No. PCT/JP01/06262, filed Jul. 19, 2001.

TECHNICAL FIELD

The present invention relates to a novel surfactant aqueous solution for development of a coating layer, and more specifically to a novel surfactant aqueous solution for development of a coating layer, which is used in the method of forming resist patterns in manufacturing semiconductor elements where a trench pattern and a hole pattern are effectively made finer by forming a resist pattern, forming a coating layer on the resist pattern formed, and then thickening the resist pattern, and a method of forming fine resist patterns using this surfactant aqueous solution.

BACKGROUND ART

In the wide field of manufacturing semiconductor elements such as LSIs, producing liquid crystal display surfaces of LCD panels, manufacturing circuit substrate for a thermal head, and like use, resist patterns have been formed on substrates for formation of fine elements or fine processing. In the formation of resist patterns, a so-called photolithography process has been employed which involves exposing by selectively irradiating a photosensitive resin composition with an actinic ray such as ultraviolet ray, deep ultraviolet ray, excimer laser, x-ray, or electron beams and developing the resin composition. In the photolithography process, negative or positive-working photosensitive resin compositions are used to form resist patterns. With the recent trend of higher integration of semiconductor devices, wiring and separation widths required in the manufacturing process of the semiconductor device are becoming finer, and, in order to keep up with this trend, exposure equipment employing a short-wavelength light source such as g-line, i-line, or excimer laser or phase shift masks are used in the exposure. However, with the lithography technique employing the conventional exposure, it is difficult to form resist patterns that are finer than the limit provided by the wavelength. On the other hand, exposure equipment for short-wavelength and equipment employing phase shift masks are expensive. Therefore, methods to effectively make resist patterns finer, which use conventionally known positive or negative-working photosensitive resin compositions and conventionally known pattern formation equipment without using the expensive equipment, have been intensively investigated, and are disclosed, for example, Japanese Patent Application Laid-Open Nos.5-241348, 6-250379, 10-73927, and 11-204399. The methods described in these publications involve following steps, that is, employing a conventional photosensitive composition, forming a pattern by conventional methods, forming a coating layer on the resist pattern formed, allowing an acid generated by heating and/or exposure to light of the resist or present in the resist to diffuse into the coating layer, crosslinking and curing the coating layer by the action of the acid which has diffused into the coating layer, removing the uncrosslinked coating layer to thicken the resist pattern, and, as a result, the intervals between the resist patterns are narrowed, and the separation size or hole aperture size of the resist patterns are reduced to make resist patterns finer and to effectively form resist patterns which are fine to a degree below the resolution limit.

In the methods of forming fine patterns mentioned above, a water-soluble photosensitive or non-photosensitive resin composition which can be crosslinked by an acid is used as a composition for forming a coating layer, and water or a mixed solvent with water and an organic solvent is used for development and removal of uncrosslinked coating layer. When water or a mixed solvent with water and an organic solvent is used as a developer and the coating layer is excessively insolubilized, there arise such problems that bridging may be formed in the resist pattern after development, development residues such as scum may be generated, and components containing hydrophobic groups in the water-soluble resin composition for coating layers may adhere as insolubles to the surface of wafer during the development, which result in pattern defect (see FIGS. 1 and 2). Although the bridging and scum may be prevented in some cases by applying existing approaches such as discharging a lot of developer comprising water or water and an organic solvent or by increasing the number of times of paddle development, it is difficult to control the reproducibility and uniformity of pattern dimensions made finer. Therefore, there has been required a improvement for higher yield, easier operation, and more stable process.

When a water-soluble resin composition which crosslinks by an acid to form an insolubilized layer is used as a material to form a coating layer, the acid concentration generated in the base resist pattern varies depending on the locations in cases where several patterns with different pattern dimensions are present in the base resist pattern, or patterns are configured sparsely and densely, or a certain arrangement of the pattern is present. This unevenness produces a variation in the crosslinking density in the coating layer, which lowers the dimensional controllability of the resultant pattern. Furthermore, when a solution such as a mixed solution of water and an organic solvent which shows a high solubility toward the coating layer is used as a developer, the dissolution rate varies in the different pattern arrangements, which results in reduced dimensional controllability of the resultant pattern. Since attempts to substantially avoid this problem requires slight changes in the design of the exposure pattern such as the pattern dimension and pattern arrangement of the base resist, this situation is in need of improvement in terms of the cost and easiness of manufacturing semiconductor devices.

Examples of the method of forming fine resist patterns mentioned above include use of water or aqueous TMAH (tetramethylammonium hydroxide) solution for development of a coating layer comprising a water-soluble resin composition as disclosed in Japanese Patent Application Laid-Open No.10-73927 and development of a coating layer comprising a water-soluble resin composition with a solution comprising water and an organic solvent, which has a high solubility to the composition, and rinsing the coating layer with a solution having a low solubility to the composition such as water as disclosed in Japanese Patent Application Laid-Open No.11-204399. Although the latter patent application describes the solution with a high solubility contains a surfactant, neither specific examples of the surfactant nor the effect of the surfactant are described. These conventional methods may result in development defect and pattern defect without enough dimensional controllability of the resultant fine resist pattern. Under the present circumstances, coating layers cannot be formed independent on the dimension and arrangement of the base resist pattern and without influencing the base resist pattern and the shrunk resist pattern, and the dimensional controllability of the resultant resist pattern cannot be significantly improved.

Furthermore, Japanese Patent Application Laid-Open No. 11-204399 describes that the developer contains a surfactant, but there are problems in such a case that air bubbles are formed when a developer is discharged onto a wafer in development, and all of the generated air bubbles do not disappear in the developer, which makes the development uneven and produces a pattern with low dimensional controllability. Therefore, a low-frothing surfactant or a surfactant which highly defoams even if it once froths up is required as a surfactant for use in a developer.

It is an object of the present invention to provide an surfactant aqueous solution for development of a coating layer which is free from the above-mentioned problems and a method of forming fine resist patterns which employs this surfactant aqueous solution.

Accordingly, the object of the present invention is to provide an surfactant aqueous solution for development of a coating layer, which can prevent formation of bridging caused by excessive crosslinking, generation of development residues such as scum, and reattachment of insolubles, and which does not influence the base resist pattern or the resist pattern made finer (or shrunk), and which works independent of the dimension and pattern arrangement of the base resist pattern, and which cannot cause uneven development attributable to froths of the developer, and which can improve the dimensional controllability of the pattern, in the method of forming a pattern where a trench pattern and a hole pattern can be effectively made finer to a degree below the resolution limit by forming a coating layer on a resist pattern and thickening the resist pattern, and a method of forming fine resist patterns which employs this surfactant aqueous solution

DISCLOSURE OF THE INVENTION

As a result of intensive investigation, the inventor has found that, when an aqueous solution containing a surfactant with a specific structure is used as a developer in the method of forming a pattern where a resist pattern is made finer by forming a coating layer on a resist pattern formed by the conventional method and then thickening the resist pattern, generation of development defect and pattern defect such as bridging and scum is suppressed and the dimensional controllability in the miniaturization of patterns is improved, thus having achieved the present invention based on the finding.

Accordingly, the present inventions are surfactant aqueous solution s for development of a coating layer and a method of forming a pattern comprising the following constitutions.

(1) An surfactant aqueous solution for development of a coating layer comprising a surfactant and water or a mixture of water and an organic solvent, wherein the surfactant comprises at least one selected from an N-acylsarcosinate, an N-acyl-N-methylalaninate, an N-acyltaurinate, an N-acyl-N-methyltaurinate, a fatty acid alkylol amide, and a fatty acid alkylol amide polyoxyethylene adduct.

(2) The surfactant aqueous solution for development of a coating layer according to above-mentioned (1), wherein the number of carbon atoms of the acyl group of the surfactant is 10 to 14.

(3) The surfactant aqueous solution for development of a coating layer according to above-mentioned (1) or (2), wherein the surfactant is at least one selected from an N-lauroylsarcosinate, an N-lauroyl-N-methylalaninate, an N-lauroyltaurinate, and an N-lauroyl-N-methyltaurinate.

(4) The surfactant aqueous solution for development of a coating layer according to above-mentioned (1), wherein the counter ion of the N-acylsarcosinate, the N-acyl-N-methylalaninate, the N-acyltaurinate, and the N-acyl-N-methyltaurinate is an organic amine or an organic amine salt.

(5) The surfactant aqueous solution for development of a coating layer according to above-mentioned (1) or (2), wherein the number of carbon atoms of the fatty acid of the fatty acid alkylol amide or the fatty acid alkylol amide polyoxyethylene adduct is 6 to 22, and the number of carbon atoms of the alkylol group thereof is 1 to 3, and the number of repeating units of the polyoxyethylene chain of the fatty acid alkylol amide polyoxyethylene adduct is 10 or less.

(6) The surfactant aqueous solution for development of a coating layer according to any one of above-mentioned (1) to (5), wherein the concentration of the surfactant is 0.01 to 10.0% by weight.

(7) The surfactant aqueous solution for development of a coating layer according to any one of above-mentioned (1) to (6), wherein the organic solvent comprises at least one selected from a saturated or unsaturated alcohol with 1 to 8 carbon atoms, a saturated polyvalent alcohol with 2 or 3 hydroxyl groups, a saturated or unsaturated alkyl amine with 1 to 3 carbon atoms, and a saturated or unsaturated alkanol amine with 1 to 3 carbon atoms.

(8) The surfactant aqueous solution for development of a coating layer according to any one of above-mentioned (1) to (7), wherein water and the organic solvent are mixed in a ratio of water to the organic solvent of 80:20 to 99:1.

(9) A method of forming a pattern comprising forming a coating layer on a resist pattern, thickening the resist pattern by crosslinking of the coating layer, and removing the uncrosslinked coating layer with a developer to effectively make the pattern finer, wherein the surfactant aqueous solution for development of a coating layer according to any one of above-mentioned (1) to (8) is used as a developer.

The present invention will be described hereinafter.

In the surfactant aqueous solution of the present invention, an N-acylsarcosinate, an N-acyl-N-methylalaninate, an N-acyltaurinate, an N-acyl-N-methyltaurinate, a fatty acid alkylol amide, or a fatty acid alkylol amide polyoxyethylene adduct is used as a surfactant. The acyl group in the surfactant preferably has 10 to 14 carbon atoms.

Specific examples of the surfactant which can be preferably used in the surfactant aqueous solution of the present invention include N-acylsarcosinates such as, for example, coconut oil fatty acid sarcosinate, lauroylsarcosinate, myristoylsarcosinate, and oleoylsarcosinate; N-acyl-N-methylalaninates such as, for example, coconut oil fatty acid methylalaninate, lauroylmethylalaninate, myristoylmethylalaninate, and oleoylmethylalaninate; N-acyltaurinates such as, for example, N-lauroyltaurinate, N-myristoyltaurinate, and N-oleoyltaurinate; N-acyl-N-methyltaurinates such as, for example, N-lauroyl-N-methyltaurinate, N-myristoyl-N-methyltaurinate, and N-oleoyl-N-methyltaurinate; fatty acid alkylol amides and fatty acid alkylol amide polyoxyethylene adducts such as, for example, coconut oil fatty acid monoethanol amide, coconut oil fatty acid diethanol amide, lauric acid monoethanol amide, lauric acid diethanol amide, myristic acid monoethanol amide, myristic acid diethanol amide, stearic acid monoethanol amide, stearic acid diethanol amide, palmitic acid monoethanol amide, palmitic acid diethanol amide, oleic acid monoethanol amide, oleic acid diethanol amide, palm kernel oil monoethanol amide, palm kernel oil fatty acid diethanol amide, lauric acid monoisopropanol amide, myristic acid monoisopropanol amide, stearic acid monoisopropanol amide, palmitic acid monoisopropanol amide, oleic acid monoisopropanol amide, palm kernel oil fatty acid monoisopropanol amide, and polyoxyethylene adducts thereof.

Among these surfactants, an N-acylsarcosinate, an N-acyl-N-methylalaninate, an N-acyltaurinate, or an N-acyl-N-methyltaurinate with its acyl group being a lauroyl group is preferable, and a fatty acid alkylol amide or a fatty acid alkylol amide polyoxyethylene adduct with its acyl group of the fatty acid being a lauroyl group is preferable, and specifically, N-lauroylsarcosinate, N-lauroyl-N-methylalaninate, N-lauroyltaurinate, or N-lauroyl-N-methyltaurinate, lauric acid monoethanol amide, or lauric acid diethanol amide is more preferable.

Among these surfactants, any counter ion can be used, provided it is a basic ion, for an N-acylsarcosinate, an N-acyl-N-methylalaninate, an N-acyltaurinate, or an N-acyl-N-methyltaurinate, but an organic amine or an organic amine salt is preferable. Specific examples of the organic amine used as a counter ion of the surfactant in the present invention include, for example, alkanol amines such as monoethanol amine, diethanol amine, triethanol amine, N-methylethanol amine, or N-ethylethanol amine, and alkyl amines such as monoethyl amine, diethyl amine, or triethyl amine. Examples of the organic amine salt include, for example, tetramethylammonium hydroxide and tetraethylammonium hydroxide.

These surfactants may be used singly or in combination with one or more of them, and may be blended in any amount provided it forms a uniform aqueous solution. The surfactant is blended at 0.01 to 10.0% by weight in view of the effect, and more preferably 0.1 to 5.0% by weight based on the total amount of the surfactant aqueous solution of the present invention.

The surfactant used in the present invention is preferably freed of organic impurities, metal ions, chlorine ion and so on by means of distillation, salting out, recrystallization, ion exchange treatment, desalting by ultrafiltration, filtering treatment, and various adsorption treatments. However, preservatives such as paraben may be used in order to improve rot proof properties.

Although the solvent of the surfactant aqueous solution of the present invention is desirably water, a water-soluble organic solvent may be mixed when the solubility of the surfactant is low, or the surfactant aqueous solution is highly frothy, or resists spreading over a pattern. Although any water-soluble organic solvent may be used, saturated or unsaturated alcohols with 1 to 8 carbon atoms such as methanol, ethanol, propanol, or isopropanol, saturated polyvalent alcohols with 2 or 3 hydroxyl groups such as ethylene glycol, diethylene glycol, or glycerol, saturated or unsaturated alkyl amines with 1 to 3 carbon atoms such as monomethyl amine, dimethyl amine, trimethyl amine, monoethyl amine, ethanol amine, or diethanol amine, alkyl amine salts such as tetramethylammonium salts, and mixture of two or more thereof are used in view of the effect. The organic solvent may be blended at any concentration provided it is miscible with water, but the organic solvent is preferably blended at 1.0 to 20.0% by weight, and more preferably 1.0 to 5.0% by weight based on the total amount of the surfactant aqueous solution of the present invention.

No specific limitation is set on the quality of water to dissolve the surfactant and the organic solvent in the present invention, but water is preferably freed of organic impurities, metal ions, and chlorine ion by means of distillation, ion exchange treatment, filtering treatment, various adsorption treatments etc. Furthermore, the surfactant aqueous solution of the present invention is preferably subjected to a treatment to remove impurities as described above, and is desirably free from solid matter of quarter micron size or larger.

For the development of the coating layer with the surfactant aqueous solution of the present invention, the same methods as the conventionally known development methods of the resists can be employed, and development equipment conventionally used for the development of resists can be used. Generally, development is conducted with a development nozzle such as a soft impact nozzle by paddle development or shower development, and subsequently the surfactant left on the surface and inside of the resist pattern is rinsed away with pure water. A mixture of water and an alcohol such as ethanol or isopropanol, an organic amine such as triethylamine, or an organic amine salt such as tetramethylammonium salt may be used instead of pure water for rinsing. Furthermore, the resist may be baked to remove water in the pattern after the development step.

Furthermore, in order to use the surfactant aqueous solution of the present invention more effectively, it is desirable to control the solution temperature, the discharging pressure and time from the nozzle, and the humidity and temperature of the development container in the appropriate range.

No specific limitation is set on the resin composition for coating layer on which the surfactant aqueous solution for development of a coating layer of the present invention works effectively provided it is a resin composition for coating layer which has been ever reported, and commercially available examples thereof include AZ R200 ('AZ' is a registered trademark, and this applies to the following part) manufactured by Clariant (Japan) K.K. and it is easily obtainable.

BEST MODE FOR CARRYING OUT THE INVENTION

Figure 1:
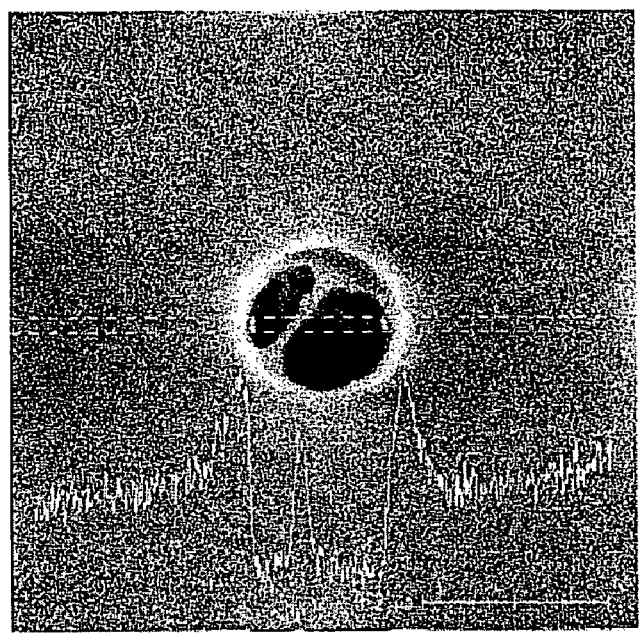
FIG. 1 shows a contact hole pattern observed under microscope, on which development residues are present.

The present invention will be described in more detail with reference to examples and comparative examples hereinafter, but embodiments of the present invention are not limited to these examples.

Preparation of Surfactant Aqueous Solution S

Components were mixed in the following ratio (weight ratio), stirred thoroughly to dissolve, and the resultant solution was filtered with a 0.1 µm filter to prepare surfactant aqueous solution s A and B.

| [Surfactant aqueous solution A] | |
|---|---|
| N-lauroylsarcosine triethanolamine | 5.0 |
| Water | 95.0 |

-continued

[Surfactant aqueous solution B]

| | |
|---|---|
| N-lauroyl-N-methylalanine triethanolamine | 5.0 |
| Water | 95.0 |

Comparative Developer

As a comparative developer to compare with the above-mentioned surfactant aqueous solution s A and B, AZ R2 Developer (an organic solvent aqueous solution which does not contain a surfactant) commercially available from Clariant (Japan) K.K. was used. As other comparative developers, AZ 600MIF and AZ AQUATAR manufactured by Clariant (Japan) K.K. which are aqueous solutions containing surfactants other than the surfactant used in the present invention were used.

Formation of Line and Space Pattern and Contact Hole Pattern

An HMDS-treated 6-inch silicon wafer was coated with a positive-working photosensitive resin composition, AZ DX5400P manufactured by Clariant (Japan) K.K., by using a spin coater (MK-V) manufactured by Tokyo Electron Ltd. and pre-baked on a hot plate at 90° C. for 60 seconds to form a resist layer of about 0.54 µm in thickness. The wafer was then exposed through line and space patterns with various space widths by using exposure equipment having an exposure wavelength of KrF laser (248 nm) (FPA-3000EX5 manufactured by Canon Inc., NA=0.63), subjected to post-exposure baking (PEB) on a hot plate at 110° C. for 90 seconds, and subjected to spray paddle development with an alkaline developer (AZ 300MIF developer, an aqueous solution containing 2.38% by weight of tetramethylammonium hydroxide) manufactured by Clariant (Japan) K.K. at 23° C. for one minute to obtain a positive resist pattern.

Formation of Contact Hole Pattern

An HMDS-treated 6-inch silicon wafer was coated with a positive-working photosensitive resin composition, AZ DX3200SC manufactured by Clariant (Japan) K.K., by using a spin coater (MK-V) manufactured by Tokyo Electron Ltd. and pre-baked on a hot plate at 80° C. for 90 seconds to form a resist layer of about 0.76 µm in thickness. The wafer was then exposed through hole patterns with various hole diameters by using exposure equipment (FPA-3000EX5 manufactured by Canon Inc., NA=0.63) having an exposure wavelength of KrF laser (248 nm), subjected to post-exposure baking (PEB) on a hot plate at 110° C. for 60 seconds, and subjected to spray paddle development with an alkaline developer (AZ 300MIF developer, an aqueous solution containing 2.38% by weight of tetramethylammonium hydroxide) manufactured by Clariant (Japan) K.K. at 23° C. for one minute to obtain a positive resist pattern.

EXAMPLES 1 AND 2, COMPARATIVE EXAMPLE 1

The line and space pattern and the contact hole pattern were coated with AZ R200 manufactured by Clariant (Japan) K.K. by using a spin coater (MK-V) manufactured by Tokyo Electron Ltd. and baked on a hot plate at 85° C. for 70 seconds to form a water-soluble resin film of about 0.4 µm in thickness. The patterns were then subjected to mixing bake on a hot plate at 115° C. for 70 seconds to promote the crosslinking reaction of the water-soluble resin film, and then subjected to paddle development with the above-mentioned surfactant aqueous solution A or B, and AZ R2 Developer at 23° C. for one minute to remove the uncrosslinked layer to form a crosslinked, insolubilized layer on the line and space pattern and the contact hole pattern. The patterns were baked on a hot plate at 110° C. for 70 seconds to dry them. The resultant shrunk patterns were evaluated for dimensional shrinkage and generation of development residues. The results are shown in Table 1.

[Dimensional Shrinkage Evaluation]

The space width in the line and space pattern and the hole diameter in the hole pattern were measured by using S-9200 Advanced CD-measurement SEM manufactured by Hitachi Ltd., before and after formation of the insolubilized layer, and the shrinkage rates were calculated according to the following formula and used for the evaluation of dimensional shrinkage.

Shrinkage rate (%)=[{(dimension before formation of insolubilized layer)−(dimension after formation of insolubilized layer)}/(dimension before formation of insolubilized layer)]×100

[Evaluation of Generation of Development Residues]

A hundred points on the whole surface of the silicon wafer were observed by using S-9200 Advanced CD-measurement SEM manufactured by Hitachi Ltd. before and after formation of the insolubilized layer, and the number of the points where development residues such as bridging and scum were present was counted and used for the evaluation of generation of development residues.

Figure 2:
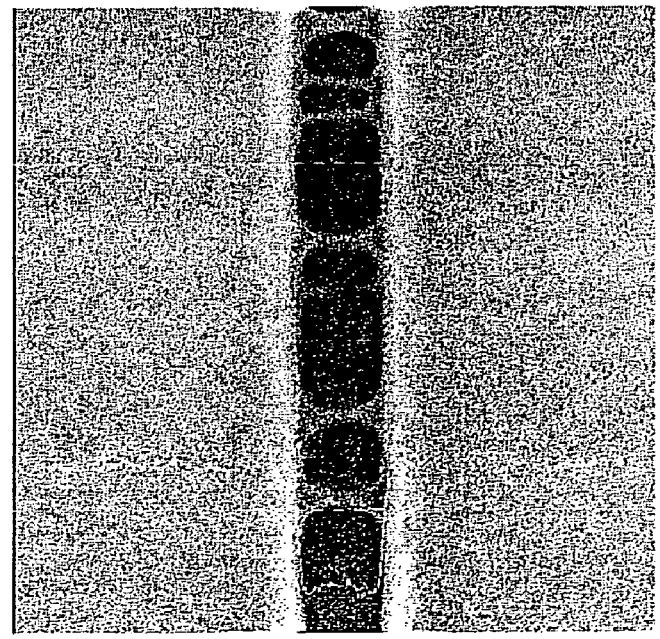
FIG. 2 shows a line and space pattern observed under microscope, on which development residues are present.

Incidentally, examples of a contact hole pattern and line and space pattern where development residues are present are shown in FIGS. 1 and 2. In the above-mentioned evaluation of generation of development residues, even a point where a slight residue was found was counted as one point regardless of the degree of generation.

TABLE 1

| Kind of patterns | Examples or Comparative Examples No. | Kind of surfactant aqueous solution s | Pattern size (µm) | | Ratio of shrinkage (%) | Numbers of development residues generated (points/100 points basis) |
|---|---|---|---|---|---|---|
| | | | Before shrinkage | After shrinkage | | |
| Contact hall pattern | Example 1 | A | 0.219 | 0.137 | 37.4 | 0 |
| | Example 2 | B | 0.221 | 0.142 | 35.7 | 2 |
| | Comparative Example 1 | R2 Developer | 0.219 | 0.151 | 31.1 | 48 |
| Line and Space | Example 1 | A | 0.221 | 0.126 | 43.0 | 1 |
| | Example 2 | B | 0.220 | 0.132 | 40.0 | 0 |

TABLE 1-continued

| Kind of patterns | Examples or Comparative Examples No. | Kind of surfactant aqueous solution s | Pattern size (μm) Before shrinkage | Pattern size (μm) After shrinkage | Ratio of shrinkage (%) | Numbers of development residues generated (points/100 points basis) |
|---|---|---|---|---|---|---|
| Pattern | Comparative Example 1 | R2 Developer | 0.220 | 0.142 | 35.5 | 100 |

Table 1 above shows the surfactant aqueous solution for development of a coating layer of the present invention can prevent the generation of pattern defect and has superior dimensional shrinkage controllability.

EXAMPLES 3 AND 4, COMPARATIVE EXAMPLES 2, 3, AND 4

Evaluation of Frothing Properties 1

The line and space pattern and contact hole pattern obtained in the above-mentioned manner were coated with an water-soluble resin by using a spin coater (MK-V) manufactured by Tokyo Electron Ltd. and baked on a hot plate at 85° C. for 70 seconds to form a water-soluble resin film of about 0.4 μm in thickness. The patterns were then subjected to mixing baking on a hot plate at 115° C. for 70 seconds to promote the crosslinking reaction of the water-soluble resin film, and the above-mentioned surfactant aqueous solution A or B, R2 Developer, AZ 600MIF, and AZ AQUATAR were spread on the patterns at 23° C., and air bubbles formed in the step were inspected by eyes. The results are shown in Table 2, "Frothing properties on wafer" column.

The evaluation of frothing property 1 was made according to the following criteria.

The frothing properties were rated as "high" when fine air bubbles were seen all over the wafer, "medium" when fine air bubbles were present at the edge of the water (when the air bubbles covered less than 10% of the whole surface area of the wafer), and "low" when few fine air bubbles were present.

EXAMPLES 5 AND 6, COMPARATIVE EXAMPLES 5, 6, AND 7

Evaluation of Frothing Properties 2

The frothing properties of the surfactant aqueous solution s were evaluated by a different method from the above-mentioned evaluation of frothing properties 1.

Approximately 12 g of the above-mentioned surfactant aqueous solution A or B, R2 Developer, AZ 600MIF, and AZ AQUATQR were respectively placed into a 50 ml transparent glass container, and the container was agitated by using a touch mixer for 30 seconds, and the air bubbles were inspected by eyes to measure the time taken till all the air bubbles disappeared. The results are shown in Table 2, "Deforming properties after shaking" column.

TABLE 2

| Kind of surfactant aqueous solution s | Frothing properties on the wafer | Deforming properties after shaking (hour) |
|---|---|---|
| A | Low (Example 3) | 0.5 (example 5) |
| B | Low (Example 4) | 1.0 (example 6) |
| R2 Developer | Nil (Comparative Example 2) | 0 (Comparative Example 5) |
| AZ 600MIF | Low (Comparative Example 3) | 0.5 (Comparative Example 6) |
| AZ AQUATAR | High (Comparative Example 4) | 24.0 (Comparative Example 7) |

Table 2 shows the surfactant aqueous solution of the present invention shows frothing properties and deforming properties, which are equal to or lower than the conventional developers.

EFFECT OF THE INVENTION

As described above in detail, use of the surfactant aqueous solution of the present invention as a developer can prevent formation of development residues and pattern defects, and can form a coating layer with excellent dimensional controllability in the step of pattern miniaturization, in the pattern formation method where a trench pattern and a hole pattern can be effectively made finer by forming a coating layer on a resist pattern formed by the conventional method and thickening the resist pattern. Furthermore, fine processing can be effected with a high yield without the need of larger facilities in the recent manufacture of highly integrated semiconductor elements.

The invention claimed is:

1. A developer comprising a surfactant and water or a mixture of water and an organic solvent, wherein the surfactant comprises at least one selected from an N-acylsarcosinate, an N-acyl-N-methylalaninate, an N-acyltaurinate, and an N-acyl-N-methyltaurinate, where the counter ion of the N-acylsarcosinate, the N-acyl-N-methylalaninate, the N-acyltaurinate, and the N-acyl-N-methyltaurinate is an organic amine or an organic amine salt, wherein said developer is used for forming a pattern comprising forming a coating layer on a resist pattern, thickening the resist pattern by crosslinking of the coating layer, and removing the uncrosslinked coating layer with the developer to effectively make the pattern finer.

2. The developer according to claim 1, wherein the number of carbon atoms of the acyl group of the surfactant is 10 to 14.

3. The developer according to claim 1, wherein the surfactant is at least one selected from N-lauroylsarcosinate, N-lauroyl-N-methylalaninate, N-lauroyltaurinate, and N-lauroyl-N-methyltaurinate.

4. The developer according to claim 1, wherein the concentration of the surfactant is 0.01 to 10.0% by weight.

5. The developer according to claim 1, wherein the organic solvent comprises at least one selected from a saturated or unsaturated alcohol with 1 to 8 carbon atoms, a saturated polyvalent alcohol with 2 or 3 hydroxyl groups, a saturated or unsaturated alkyl amine with 1 to 3 carbon atoms, and a saturated or unsaturated alkanol amine with 1 to 3 carbon atoms.

6. The developer according to claim 1, wherein water and the organic solvent are mixed in a ratio of water to the organic solvent of 80:20 to 99:1.

7. A method of forming a pattern comprising forming a coating layer on a resist pattern, thickening the resist pattern by crosslinking of the coating layer, and removing the uncrosslinked coating layer with a developer to effectively make the pattern finer, wherein the developer is a surfactant aqueous solution comprising a surfactant and water or a mixture of water and an organic solvent, wherein the surfactant comprises at least one selected from an N-acylsarcosinate, an N-acyl-N-methylalaninate, an N-acyltaurinate, and an N-acyl-N-methyltaurinate, where the counter ion of the N-acylsarcosinate, the N-acyl-N-methylalaninate, the N-acyltaurinate, and the N-acyl-N-methyltaurinate is an organic amine or an organic amine salt.

8. The developer according to claim 1, wherein the pattern is selected from a line and space pattern and contact hole pattern.

9. The method according to claim 7, wherein the pattern is selected from a line and space pattern and contact hole pattern.

* * * * *